(12) United States Patent
Nicolai et al.

(10) Patent No.: US 9,883,608 B2
(45) Date of Patent: Jan. 30, 2018

(54) COOLING DEVICE FOR COOLING A SWITCHGEAR CABINET

(71) Applicant: RITTAL GMBH & CO. KG, Herborn (DE)

(72) Inventors: Michael Nicolai, Rabenau (DE); Martin Doerrich, Mittenaar (DE); Dieter Becker, Eschenburg (DE); Andreas Meyer, Giessen (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 13/261,974

(22) PCT Filed: Feb. 8, 2013

(86) PCT No.: PCT/DE2013/000074
§ 371 (c)(1),
(2) Date: Oct. 16, 2014

(87) PCT Pub. No.: WO2013/156011
PCT Pub. Date: Oct. 24, 2013

(65) Prior Publication Data
US 2015/0156918 A1 Jun. 4, 2015

(30) Foreign Application Priority Data
Apr. 19, 2012 (DE) .................. 10 2012 007 707

(51) Int. Cl.
*H05K 7/20* (2006.01)
(52) U.S. Cl.
CPC ......... *H05K 7/20145* (2013.01); *H05K 7/202* (2013.01); *H05K 7/20172* (2013.01); *H05K 7/20572* (2013.01)

(58) Field of Classification Search
CPC .......... H05K 7/20145; H05K 7/20172; H05K 7/202; H05K 7/20572; F04D 17/165; F04D 29/4226; F04D 29/4246; F04D 29/4253
(Continued)

(56) References Cited

U.S. PATENT DOCUMENTS 2,912,916 A * 11/1959 Mohrman ............. F04D 29/701
415/121.2
6,030,186 A * 2/2000 Tang ..................... F04D 17/165
415/119
(Continued)

FOREIGN PATENT DOCUMENTS

DE 3028606 A1 3/1982
DE 4021316 A1 2/1991
(Continued)

*Primary Examiner* — Len Tran
*Assistant Examiner* — Hans Weiland
(74) *Attorney, Agent, or Firm* — Marshall & Melhorn, LLC

(57) ABSTRACT

The invention relates to a cooling device for cooling of a switchgear cabinet, comprising an air inlet side for warm air and an air outlet side for cooled air, wherein a heat exchanger and at least one fan unit having a radial fan are located between the air inlet side and the air outlet side, and wherein the fan unit creates an air stream through the heat exchanger having a main flow direction between the air inlet side and the air outlet side, wherein the fan unit is located in the main flow direction behind the heat exchanger, characterized in that the fan unit comprises an air guide geometry, so that air exhausted from the radial fan is redirected into the main flow direction.

10 Claims, 5 Drawing Sheets

(58) Field of Classification Search
USPC .................................. 165/122; 361/695, 696
See application file for complete search history.

(56) References Cited

U.S. PATENT DOCUMENTS

| | | | |
|---|---|---|---|
| 7,619,887 B2 | 11/2009 | Koch et al. | |
| 7,724,513 B2 | 5/2010 | Coglitore et al. | |
| 7,861,543 B2 | 1/2011 | Carlsen et al. | |
| 8,072,756 B1 * | 12/2011 | Janes | H05K 7/20909 361/695 |
| 2008/0055846 A1 * | 3/2008 | Clidaras | H05K 7/202 361/679.41 |
| 2008/0104987 A1 * | 5/2008 | Carlsen | H05K 7/20272 62/272 |
| 2009/0129913 A1 * | 5/2009 | Schutte | H05K 7/20718 415/1 |

FOREIGN PATENT DOCUMENTS

| | | |
|---|---|---|
| DE | 19709193 A1 | 10/1997 |
| DE | 102005005296 B3 | 5/2006 |
| EP | 0353744 A2 | 2/1990 |
| GB | 2080879 A | 2/1982 |
| WO | 2008/039773 A2 | 4/2008 |
| WO | 2012/116724 A1 | 9/2012 |

* cited by examiner

COOLING DEVICE FOR COOLING A SWITCHGEAR CABINET

BACKGROUND OF THE INVENTION

The invention relates to a cooling device for cooling a switchgear cabinet, the cooling device comprising an air inlet side for warm air and an air outlet side for cooled air, wherein a heat exchanger and at least one fan unit comprising a radial fan are disposed between the air inlet side and the air outlet side, and wherein the fan unit produces an air stream having a main flow direction through the heat exchanger between the air inlet side and the air outlet side, wherein the fan unit is disposed in the main flow direction behind the heat exchanger. Such cooling device is known from postpublished international patent application PCT/EP2011/052932.

Such cooling devices are used in particular in data centers comprising a cold aisle and a hot aisle, wherein the cold aisle is separated from the hot aisle by means of a line of switchgear cabinets that are lined up next to each other. Such cooling devices are in particular implemented as inline-devices that are integrated into the line of switchgear cabinets. Such cooling devices draw the warm air out of the hot aisle via their air inlet side and exhaust cooled air via their air outlet side into the cold aisle. For dissipation of the thermal dissipation loss of the components enclosed in the switchgear cabinets cooled air is drawn from the cold aisle via a side of the switchgear cabinets that is facing the cold aisle, the air is guided through the switchgear cabinets where it heats up, and is exhausted into the hot aisle.

In order to keep the energy consumption of such cooling devices as low as possible it is best practice to equip the fan units with radial fans, in particular with such radial fans that comprise backward curved blades. However, these have the disadvantage that they are not applicable for linear routing of the air flow. If the cooling device is therefore intended to be used as an inline device as described above, so far it has not been possible in cooling devices that comprise radial fans to guide the air stream linearly between the air inlet side of the cooling device and the air outlet side of the cooling device. In particular, there is no such cooling device known in the art, wherein the air inlet side and the air outlet side are parallel sides of the cooling device, for example a back side and a front side of the cooling device. To the contrary, the utilization of radial fans in the known cooling devices always requires that the cooled air is drawn out of the cooling device laterally, that is, including an angle of 90° with respect to the main flow direction. In order to enable such air outlet, it is always necessary that the cooling device protrudes beyond the front faces of the switchgear cabinets. This, however, has disadvantages in terms of the air guidance within the cold aisle as well as in view of the commonly limited space within the cold aisle.

SUMMARY OF THE INVENTION

It is therefore an object of the invention to provide a cooling device as described above that is applicable to be arranged in the inline-mode wherein its air outlet side for cooled air is aligned with the switchgear cabinets.

This object is solved by a cooling device that is characterized in that the fan units comprise an air guide geometry, so that the air leaving the radial fan is redirected into the main flow direction, so that it is exhausted from the cooling device in the main flow direction.

Preferably, the fan unit comprises an essentially ashlar-formed fan box, wherein the radial fan is received within the fan box, and wherein the fan box comprises an air outlet on at least one of four sides that are oriented parallel with respect to the main flow direction and parallel with respect to a rotation axis of the radial fan.

In an embodiment the air guide geometry may adjoin the air outlet or the air outlets of the fan box and separates fluidically the air outlet or the air outlets from an intake of the radial fan, so that the air exhausted from the air outlet or the air outlets is guided away from the intake of the radial fan.

In an embodiment of the invention, wherein the fan box is essentially ashlar-formed and wherein on each of the four sides of the air box oriented parallel with respect to the main flow direction an air outlet is formed, the air guide geometry may comprise the form of a funnel that surrounds the four sides oriented parallel with respect to the main flow direction. Instead of a closed rotationally symmetric funnel, the funnel may also be a partial funnel so that a funnel segment is allocated at the air outlet as air guide geometry.

In the preferred embodiment the air guide geometry comprises a cross section having a 90°-curving. In the easiest way the air guide geometry comprises a first section that extends essentially perpendicularly with respect to at least one of said four sides extending parallel with respect to the main flow direction, and that connects the air guide geometry with the fan box. Advantageously this section is connected with the fan box in the main flow direction between the intake of the fan box and the air outlets. This first section may turn via a preferably large radius into a second section that extends perpendicularly with respect to the first section. The radius should be as large as possible in order to keep the pressure loss as low as possible. On the other hand the maximum radius is predetermined by the available space in the inside of the cooling device. The air guide geometry may also comprise a varying radius.

In an embodiment of the invention the cooling device comprises a plurality of air guide units, wherein adjacent air guide units are located in such a way with respect to each other that they adjoin at least in sections along their respective air guide geometry. Commonly, the fan units are lined up next to each other in vertical direction at the air outlet side of the cooling device. Preferably the air guide geometries of adjacent fan units adjoin along their free ends in order to provide an as far as possible homogeneous and rectified air stream at the air outlet side.

In another embodiment of the invention, at adjacent fan units a separative element extends between opposing sides of the adjacent fan units that separates the air outlets of the adjacent fan units from the intake of adjacent fan units in a fluidic tight manner. In this way an effective partition of the shared intake from the shared air outlet side of the fan units is achieved.

In still anther embodiment the cooling device may comprise a rack, wherein the rack comprises at the air outlet side a mounting opening having a horizontal width that is smaller than an horizontal width of the fan units, or that is equal to the horizontal width of the fan units, wherein the fan units are mounted on the rack in vertical direction one above the other, and wherein the separative element extends over the entire horizontal width of the cooling device.

BRIEF DESCRIPTION OF THE DRAWINGS

Further details of the invention are explained by means of the following drawings. Therein.

DETAILED DESCRIPTION OF THE INVENTION

Figure 1:
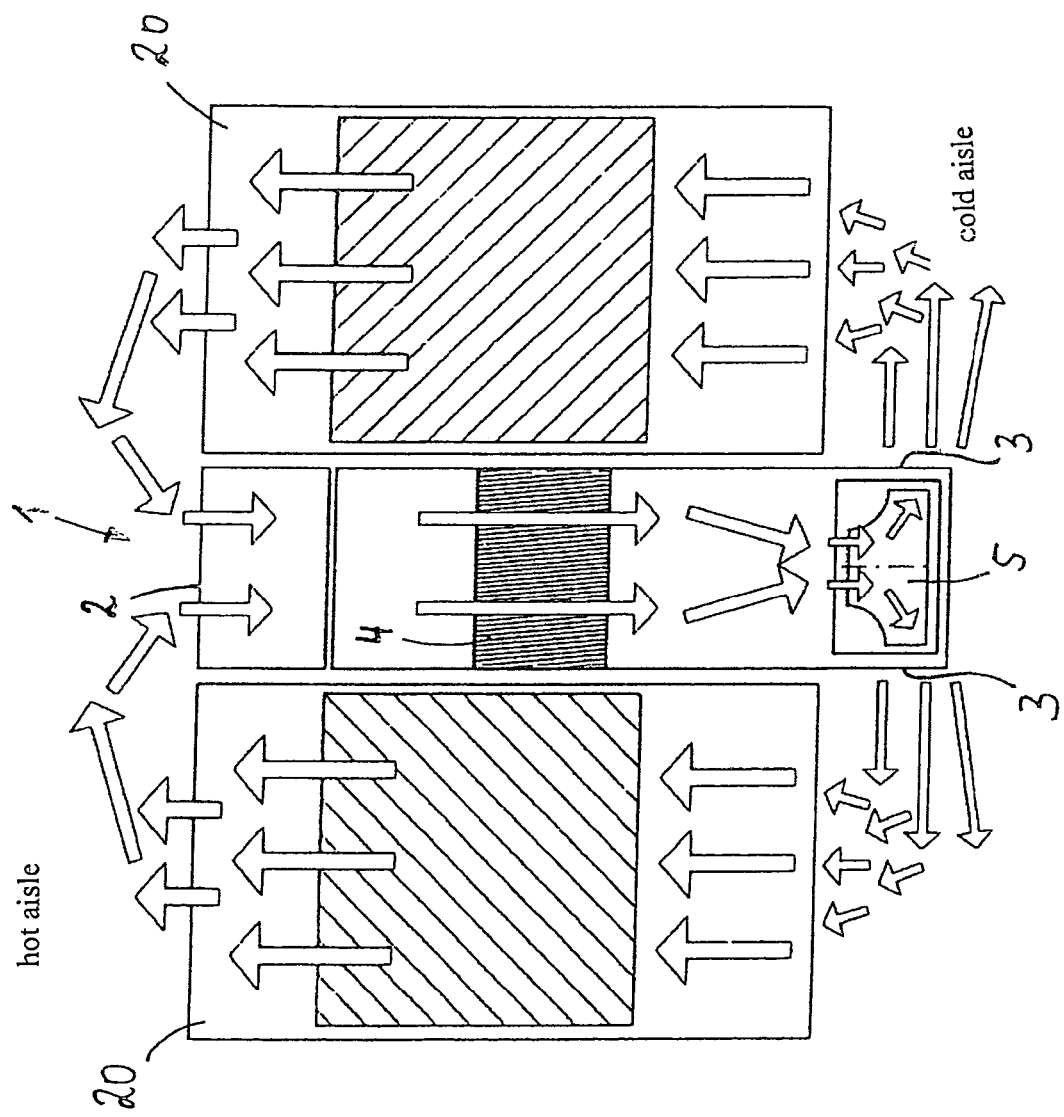
FIG. 1 shows a horizontal cross section of a switchgear cabinet line comprising an inline-cooling device according to the prior art.

FIG. 1 shows a horizontal cross section through a line of switchgear cabinets 20 into which a cooling device 1 according to the prior art is integrated. It may be seen that the cooling device 1 extends over the front sides of the switchgear cabinets 20 on the side facing the cold aisle via which the cooled air provided by the cooling device 1 is drawn in. Due to the fact that the front of the cooling device 1 extends into the cold aisle, the cooling device 1 according to the prior art forms a resistance that narrows the cold aisle locally and therefore affects the air distribution within the cold aisle in a disadvantageous manner. While the switchgear cabinets 20 exhaust warm air into the hot aisle via their back sides, the warm air is drawn in via the air inlet side 2 of the cooling device 1, is guided through the heat exchanger 4, and is exhausted laterally through a first and a second air outlet side 3 with the aid of the fan units 5 comprising a radial fan.

Figure 2:
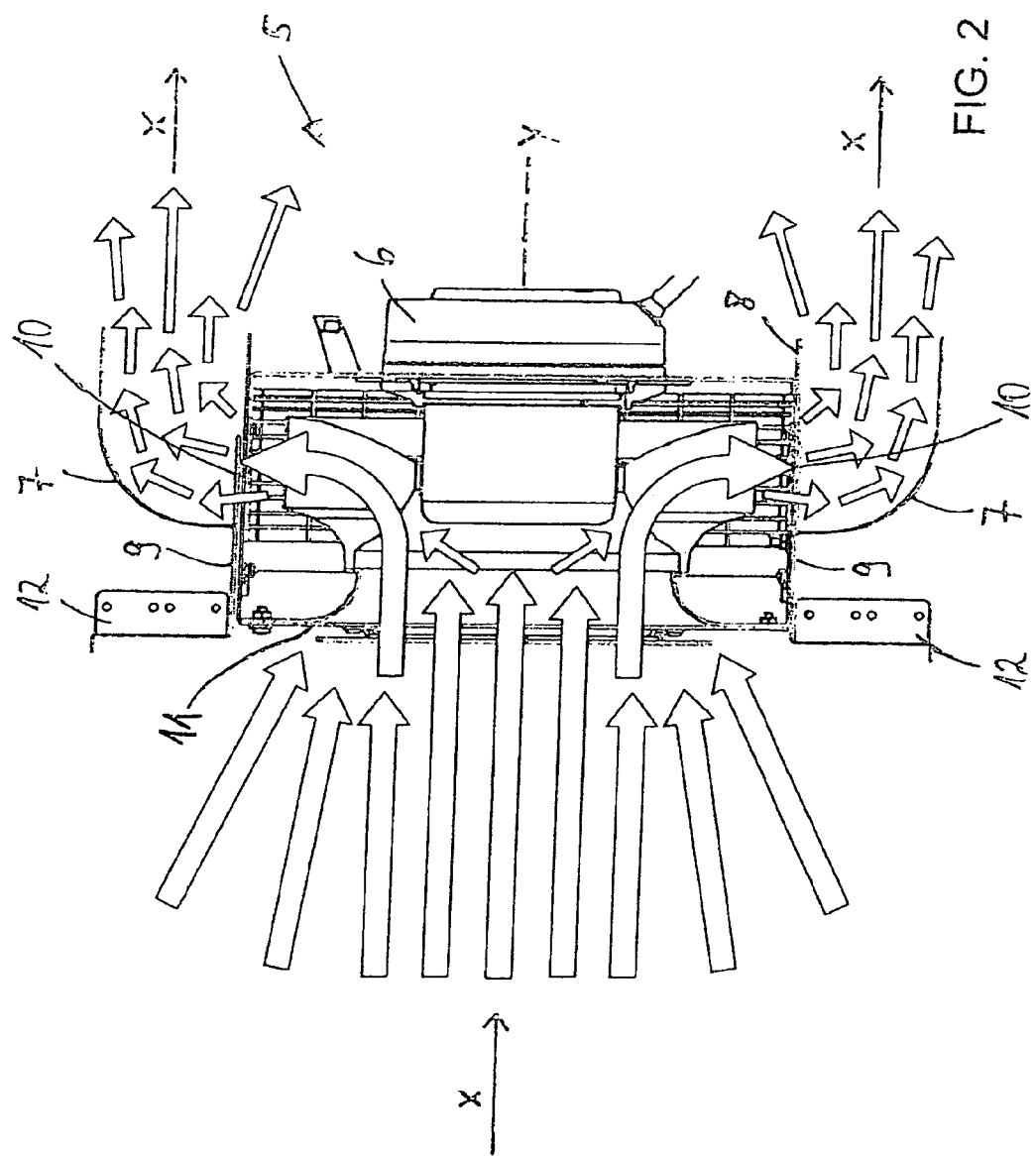
FIG. 2 shows a cross section of a fan unit according to an embodiment of the present invention.

FIG. 2 shows a cross section of a fan unit 5 according to an embodiment of the present invention. The fan unit 5 of the present invention is characterized in that the air that is drawn in via the intake 11 is exhausted laterally via the sides 9 of the fan box 8 as it is typical for radial fans, but air guide geometries 7 are associated with these sides 9 which redirect the flow direction of the air that is exhausted from the air outlets 10 in the sides 9 by 90° into the direction of the main flow direction x. The air exhausted at the front side of the fan unit 5 thus comprises the same flow direction x as the air drawn in at the intake 11. The fan unit 5 according to the present invention is therefore suitable for the linear air transport between the hot aisle and the cold aisle (compare FIG. 1). Further, separative elements 12 are provided at the fan box 8 with the aid of which further fan units 5 comprising respective separative elements 12 as well as air guide geometries 7 may be lined up in such a way that a fluidic tight separation between a common intake 11 of the lined up fan units 5 and a common air outlet side is created.

The air guide geometry 7 extends at its connection to the side 9 of the air box 8 first essentially perpendicularly, directly followed by a 90° change of direction, wherein the air guide geometry 7 in the area of its free end turns into a section that extends essentially parallel with respect to the main flow direction x. The end section of the air guide geometry 7 extends at the same height as the free end of the separative element 12 by means of which it is achieved that when congeneric fan units 5 are lined up the separative elements 12 as well as the air guide geometries 7 are placed form-locking to one another at least in their end sections. Further, the rotational axis y of the radial fan 6 is depicted which extends parallel with respect to the main flow direction x.

Figure 3:
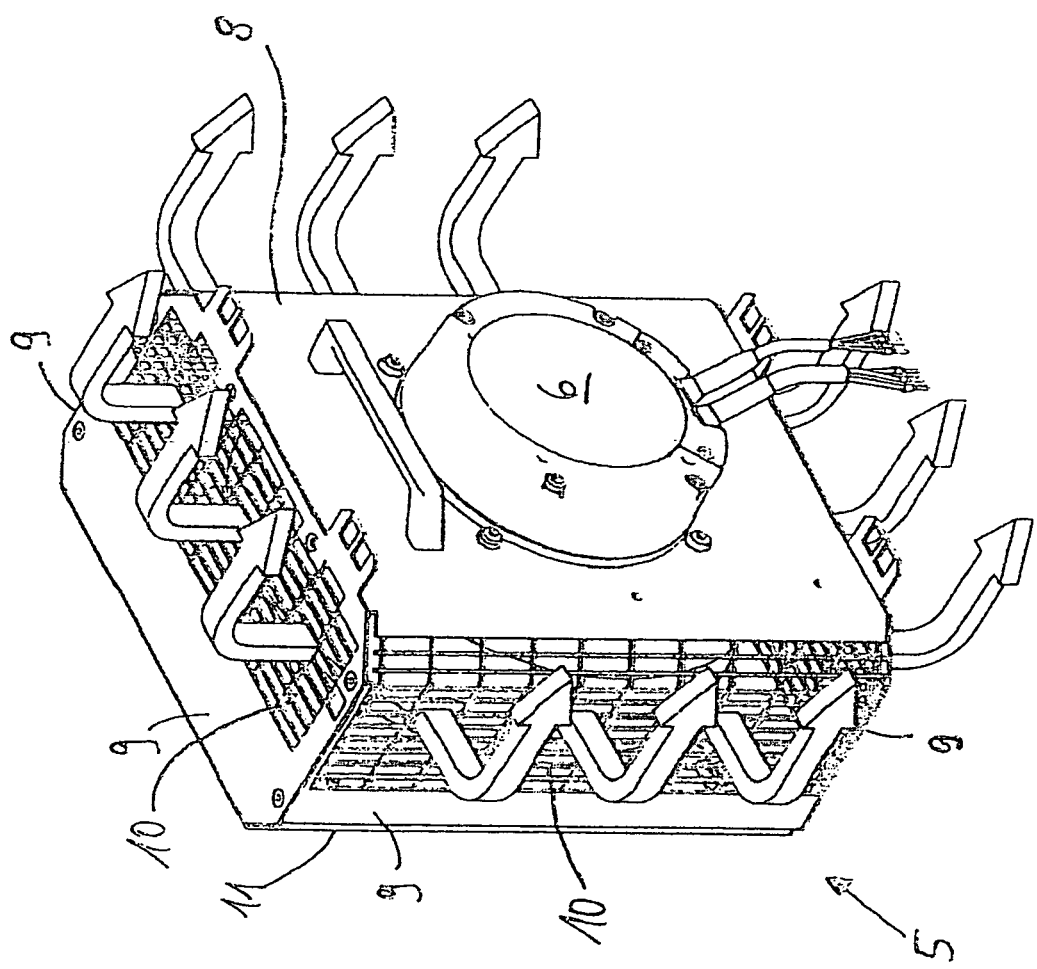
FIG. 3 shows a perspective view of the fan unit according to FIG. 2.

FIG. 3 shows a perspective view of the fan unit 5 according to FIG. 2, wherein for better understanding the air guide geometries 7 (see FIG. 2) are omitted. The fan unit 5 comprises a radial fan 6 that is received in a fan box 8. The fan box 8 is essentially ashlar-formed and comprises four sides 9 via which the air drawn in by the radial fan 6 may be exhausted. By means of the air guide geometries that are not shown the air is redirected by 90° which is illustrated by the depicted arrows. Further, it may be seen that the air inlets 10 in the sides 9 through which the air that is drawn in by the radial fan 6 is exhausted does not extend over the entire surface of the side 9. In the area of the side 9 in which the respective air outlet 10 is not formed the air guide geometry may be mounted on the fan box 8 whereby an effective separation of the air outlets 10 from the intake 11 of the fan box is achieved.

Figure 4:
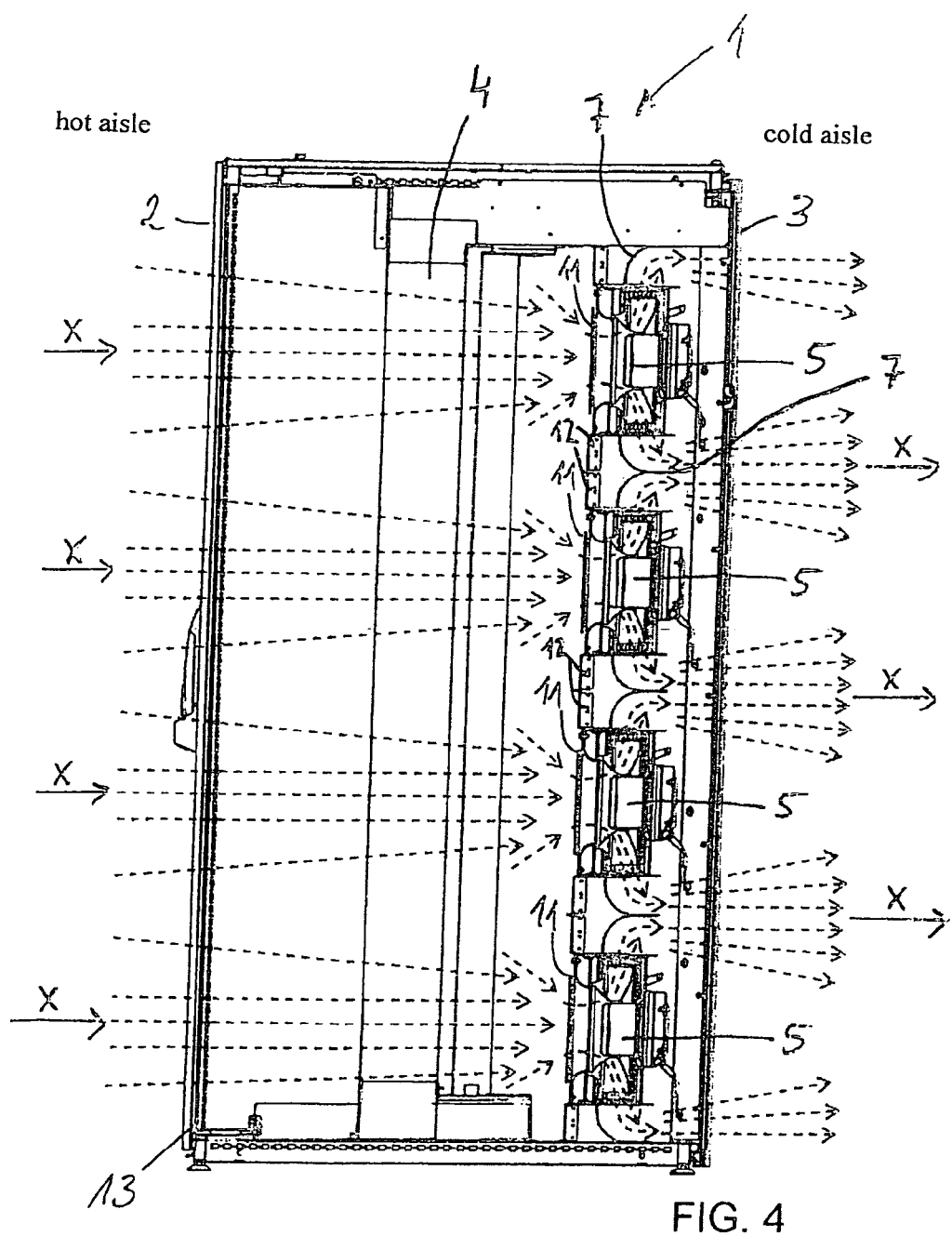
FIG. 4 shows a cross section of an embodiment of the cooling device according to the present invention.
Figure 5:
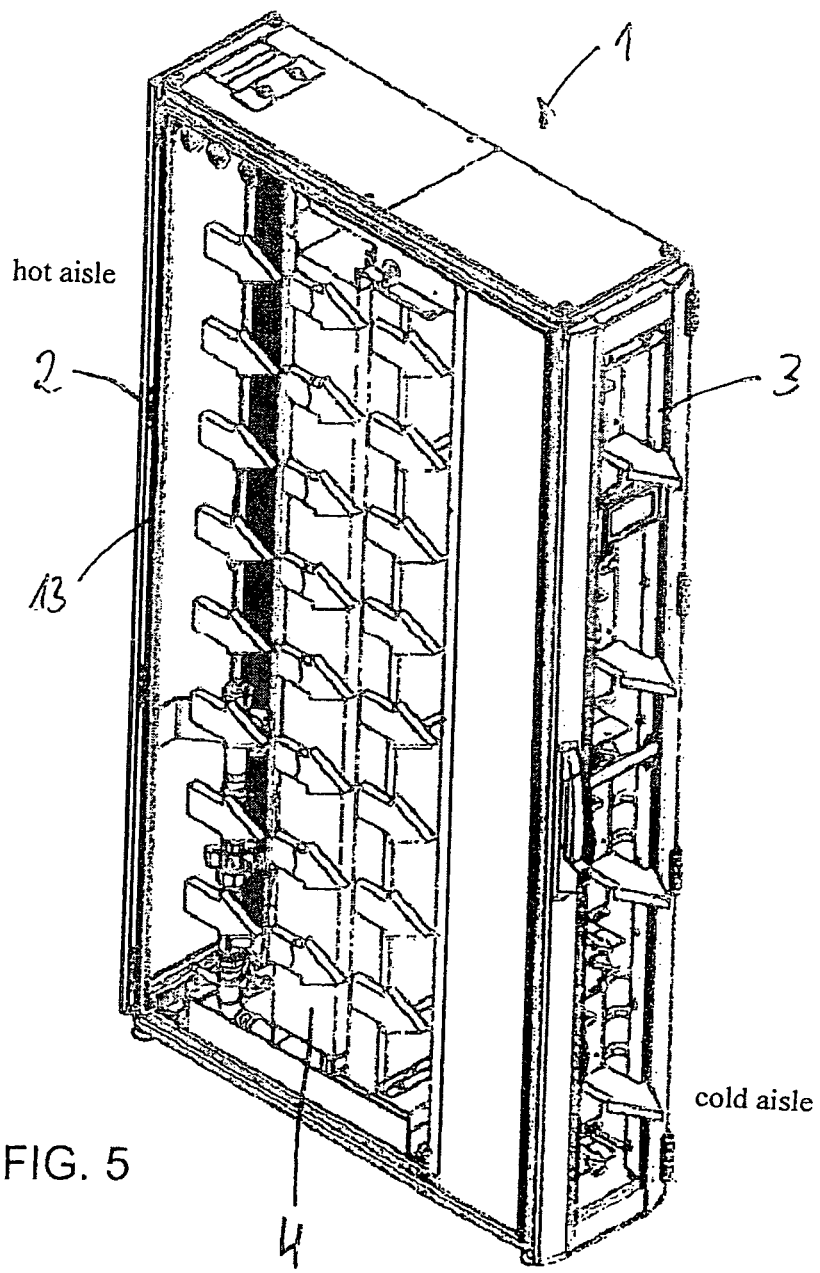
FIG. 5 shows a perspective view of the cooling device according to FIG. 4.

FIG. 4 shows a cross section of an embodiment of the cooling device 1 according to the present invention having four fan units 5 that are located one above the other in vertical direction. The cooling device 1 comprises an air inlet side 2 for warm air and air outlet side 3 for cooled air. The fan units 5 draw in air from the hot aisle through the air inlet sides 2, through the heat exchanger 4 and an optional demister unit, and exhaust it through the air outlet side 3 into the cold aisle. It may be seen that at the air inlet side 2 as well as at the air outlet side 3 the main flow direction x is the same. It may be seen further that the fan units 5 are arranged one above the other via their separative elements 12 as well as the air guide geometries 7 in such a way that an effective separation between the intake 11 of the fan units 5 and the air outlet side 3 is achieved. In the synopsis of FIGS. 4 and 5 it may be seen that the cooling device 1 according to the present invention is preferably integrated into a rack 13, wherein the rack 13 for a cooling device 1 of the present invention may not only be adapted with respect to its height to the switchgear cabinet 20 of the switchgear cabinet line into which the cooling device 1 is integrated, but also with respect to its horizontal depth parallel to the air flow direction x. It is therefore not necessary any more that the front side of the cooling device 1, at which in cooling devices according to the present invention the air outlet side 3 is located, extends beyond the front side of the switchgear cabinets 20.

The features disclosed in the preceding description, in the drawings as well as in the claims may be essential for implementation of the invention taken alone or in any combination.

REFERENCE NUMERALS 1 cooling device
2 air inlet side
3 air outlet side
4 heat exchanger
5 fan unit
6 radial fan
7 air guide geometry
8 fan box
9 side of fan box
10 air outlet
11 intake
12 separative element
13 rack
14 mounting opening
20 switchgear cabinet
x main flow direction
y rotational axis of radial fan

The invention claimed is:
1. A cooling device for cooling of a switchgear cabinet, comprising an air inlet side for warm air and an air outlet side for cooled air, wherein a heat exchanger and at least one fan unit having a radial fan are located between the air inlet side and the air outlet side, and wherein the fan unit creates an air stream through the heat exchanger having a main flow direction between the air inlet side and the air outlet side, wherein the fan unit is located in the main flow direction behind the heat exchanger, and wherein the fan unit comprises an intake and an ashlar-shaped fan box in which the radial fan is received, wherein the fan box comprises an air outlet at at least one of four sides oriented parallel with respect to the main flow direction and parallel with respect to a rotational axis of the radial fan, characterized in that the fan unit comprises an air guide geometry, which air guide geometry comprises an end section that is connected to and extends perpendicularly from a side of the fan box to a 90°-curvature, so that air exhausted from the radial fan is redirected into the main flow direction, and wherein a separative element extends from the side of the fan box, and the end section of the air guide geometry and the separative element extend the same height from the side of the fan box, the cooling device further comprising a plurality of fan units, wherein adjacent fan units are arranged in such a way with respect to each other that they adjoin to each other at least in sections along their respective air guide geometry, and wherein each fan unit comprises an intake, and wherein at adjacent fan units the corresponding separative element that extends between opposing sides of the adjacent fan units guides air exhausted from the air outlets of the adjacent fan units away from the intakes of the adjacent fan units.

2. The cooling device according to claim 1, wherein the air guide geometry adjoins to the air outlet or the air outlets of the fan box, and guides air exhausted from the air outlet or the air outlets away from the intake of the fan unit.

3. The cooling device according to claim 1, wherein the air guide geometry is formed as a funnel that surrounds the four sides oriented parallel with respect to the main flow direction or is formed as a partial funnel that surrounds at least one of the four sides that are oriented parallel with respect to the main flow direction.

4. The cooling device according to claim 1, comprising a rack, wherein the rack comprises at the air outlet side a mounting opening having a horizontal width that is smaller than a horizontal width of the fan units or that is equal to the horizontal width of the fan units, wherein the fan units are mounted on the rack in vertical direction one above the other, and wherein the separative element extends over the entire horizontal width of the cooling device.

5. The cooling device according to claim 1, wherein the radial fan is a radial fan comprising backward curved blades.

6. The cooling device according to claim 1, wherein the plurality of fan units form a fan assembly with a suction side and an exhaust side, and the fans in the fan assembly are stacked one above the other so that the suction side of the fan assembly is fluidically separated from the exhaust side.

7. The cooling device according to claim 6, wherein the end sections of adjacent 90° bent air guide geometries that are placed at the same height as free ends of the separative elements are configured to be stacked one above the other.

8. A cooling device for cooling of a switchgear cabinet, comprising an air inlet side for warm air and an air outlet side for cooled air, wherein a heat exchanger and at least one fan unit having a radial fan are located between the air inlet side and the air outlet side, and wherein the fan unit creates an air stream through the heat exchanger having a main flow direction between the air inlet side and the air outlet side, wherein the fan unit is located in the main flow direction behind the heat exchanger, and wherein the fan unit comprises an intake and an ashlar-shaped fan box in which the radial fan is received, wherein the fan box comprises an air outlet at at least one of four sides oriented parallel with respect to the main flow direction and parallel with respect to a rotational axis of the radial fan, characterized in that the fan unit comprises an air guide geometry, which air guide geometry comprises an end section that is connected to and extends perpendicularly from a side of the fan box to a 90°-curvature, so that air exhausted from the radial fan is redirected into the main flow direction, and wherein a separative element extends from the side of the fan box, and the end section of the air guide geometry and the separative element extend the same height from the side of the fan box, wherein the cooling device further comprises a plurality of fan units, wherein adjacent fan units are arranged in such a way with respect to each other that they adjoin to each other at least in sections along their respective air guide geometry, and wherein the plurality of fans form a fan assembly with a suction side and an exhaust side, and the fans in the fan assembly are stacked one above the other so that the suction side of the fan assembly is fluidically separated from the exhaust side, and wherein the end sections of adjacent 90° bent air guide geometries that are placed at the same height as free ends of the separative elements are configured to be stacked one above the other; and wherein the end sections of adjacent 90° bent air guide geometries that are placed at the same height as the free ends of the separative elements are configured to be form-locking to one another.

9. A cooling device for cooling of a switchgear cabinet, comprising an air inlet side for warm air and an air outlet side for cooled air, wherein a heat exchanger and at least one fan unit having a radial fan are located between the air inlet side and the air outlet side, and wherein the fan unit creates an air stream through the heat exchanger having a main flow direction between the air inlet side and the air outlet side, wherein the fan unit is located in the main flow direction behind the heat exchanger, and wherein the fan unit comprises an intake and an ashlar-shaped fan box in which the radial fan is received, wherein the fan box comprises an air outlet at at least one of four sides oriented parallel with respect to the main flow direction and parallel with respect to a rotational axis of the radial fan, characterized in that the fan unit comprises an air guide geometry, which air guide geometry comprises an end section that is connected to and extends perpendicularly from a side of the fan box to a 90°-curvature, so that air exhausted from the radial fan is redirected into the main flow direction, and wherein a separative element extends from the side of the fan box, and the end section of the air guide geometry and the separative element extend the same height from the side of the fan box, and wherein the at least one fan unit comprises a plurality of fan units, each with an end sections of 90° bent air guide geometries that are configured to be form-locking to one another.

10. The cooling device according to claim 9, wherein adjacent fan units of the plurality of fan units are arranged in such a way with respect to each other that they adjoin to each other at least in sections along their respective air guide geometry.

* * * * *